Figure 1:
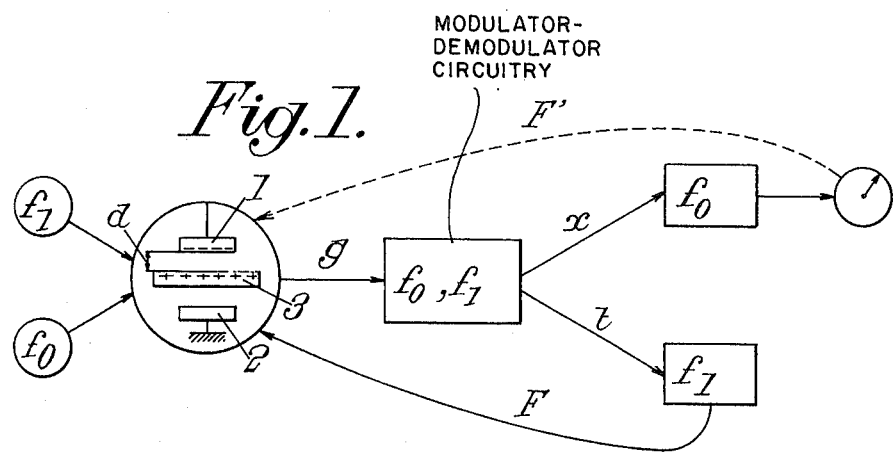

United States Patent [19]

Lewiner et al.

[11] 4,064,539
[45] Dec. 20, 1977

[54] DEVICE FOR MEASURING QUANTITIES OF ELECTRIC CHARGES OR SIMILAR ELECTRIC PARAMETERS

[75] Inventors: Jacques Lewiner, Saint-Cloud; Gérard Dreyfus, Palatseau, both of France

[73] Assignee: Agence Nationale de Valorisation de la Recherche, Neuilly-sur-Seine, France

[21] Appl. No.: 637,047

[22] Filed: Dec. 2, 1975

[30] Foreign Application Priority Data

Dec. 9, 1974   France ........................ 74.40303

[51] Int. Cl.$^2$ ............................................. H04N 5/80
[52] U.S. Cl. ........................... 358/128; 179/100.41 G; 179/100.4 M; 179/100.1 B; 324/60 C; 318/662
[58] Field of Search ............ 179/100.41 G, 100.41 P, 179/100.41 B, 100.4 M, 100.4 D, 100.3 V, 100.1 B; 360/77; 340/173 CA; 178/6.6 R, 6.6 A, 6.6 DD; 324/60 C; 318/662; 358/128, 127

[56] References Cited

U.S. PATENT DOCUMENTS

| | | |
|---|---|---|
| 3,126,535 | 3/1964 | Streeter .................................. 360/77 |
| 3,175,205 | 3/1965 | Auyang ................................... 360/77 |
| 3,198,880 | 8/1965 | Toulon ............................. 179/100.3 V |
| 3,624,284 | 11/1971 | Russell ........................... 179/100.3 V |
| 3,711,641 | 1/1973 | Palmer ......................... 179/100.41 G |
| 3,872,241 | 3/1975 | Adler ............................. 179/100.1 B |
| 3,873,763 | 3/1975 | Janssen ........................ 179/100.3 V |
| 3,946,367 | 3/1976 | Wohlmut ...................... 179/100.3 V |

FOREIGN PATENT DOCUMENTS 1,181,275   11/1964   Germany ....................... 179/100.1 B

*Primary Examiner*—Bernard Konick
*Assistant Examiner*—Alan Faber
*Attorney, Agent, or Firm*—Larson, Taylor and Hinds

[57] ABSTRACT

A device for measuring quantities of electric charges, or other electric parameters whose magnitudes can be obtained from measurements of quantities of electric charges. The device includes a capacitor having a measuring plate and another plate or an intermediate element. The electrical parameter is applied to the capacitor so that a charge representative of its magnitude is induced on the measuring plate. This induced charge is modulated at a frequency $f_o$ and at a frequency $f_1$, the frequency $f_1$ being less than $f_o/2$. An electrical signal representative of the modulation of the induced charge is generated. This signal has a first component of frequency $f_o$ whose magnitude represents the quantity of the induced charge and a second component of frequency $f_1$ whose magnitude varies according to the distance between the measuring plate and the location at which the electrical parameter is applied to the capacitor. The second component can be used as a correction signal which reduces errors due to changes in the said distance.

17 Claims, 8 Drawing Figures

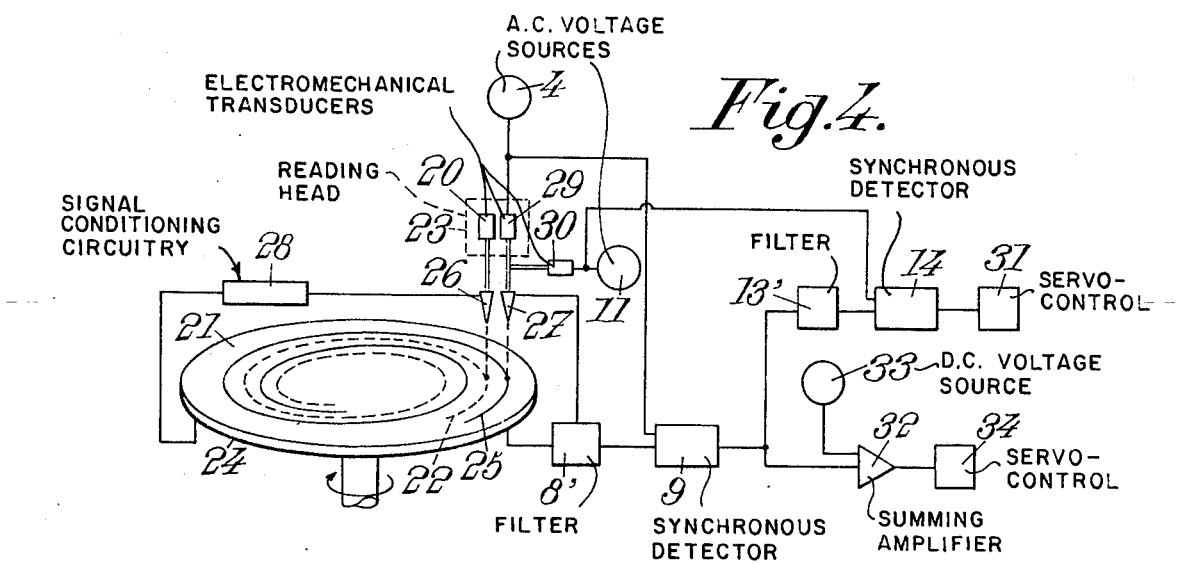
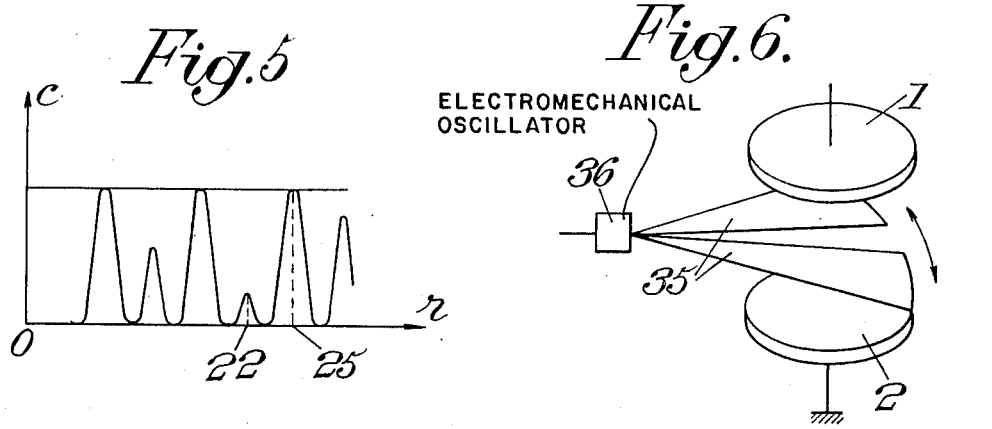
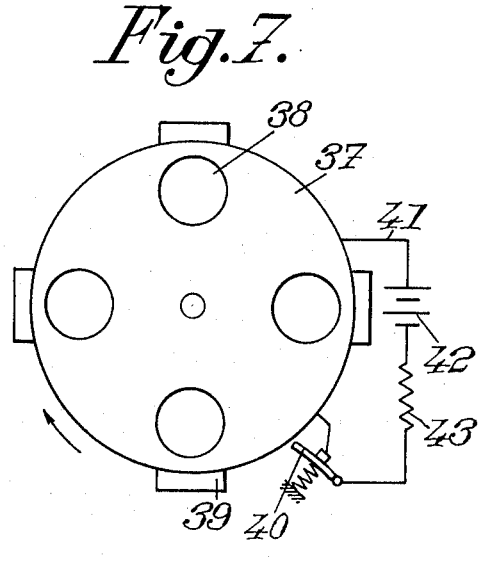
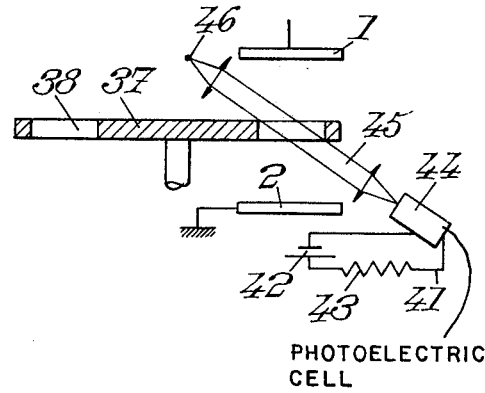

DEVICE FOR MEASURING QUANTITIES OF ELECTRIC CHARGES OR SIMILAR ELECTRIC PARAMETERS

The invention relates to devices for measuring quantities of electric charges, or for measuring other parameters such as electric voltages or currents whose magnitudes can be obtained from measurements of quantities of electric charges.

The invention relates more particularly, though not exclusively, to devices of the aforementioned kind for measuring electrical charges having surface densities between $5 \times 10^{-10}$ and $5 \times 10^{-6}$ Coulomb/cm², electric voltages between $-2500$ and $+2500$ V and electric currents between $10^{-17}$ and $10^{-5}$ A.

In the present specification, the term "measurement" will be used to mean either a measurement proper, shown by displaying numerical or other data on a suitable display device, with or without recording, or the determination of a quantity which, without being specially displayed, is immediately processed, e.g. to give an alarm or make an automatic correction, or the like.

Measuring devices of the above kind which have been proposed comprise a capacitor, means for causing the parameter to be measured to induce an electric charge on one of the two capacitor plates (hereinafter called the "measuring plate"), means for modulating the quantity of induced charge at a first frequency $f_o$, and means for measuring the parameter by generating an electric signal which alternates at a frequency $f_o$ and is related to the modulated quantities of the charges.

In these known measuring devices the electric signal depends not only on the parameter to be measured but also on the average distance $d$ between the measuring plate of the capacitor and the other plate and/or an intermediate substrate to which the parameter is applied.

If the distance $d$ remains constant with time, its effect on the measurement can be compensated by a simple calibration; it may even be conveniently ignored if the measurement is one of a series of readings which are each subjected to the same influence, in which case variations in the measured parameter are in no way affected by the value of the distance.

If this distance varies with time, however, the variations may interfere with the measurement. This is the case when the electric charges under study are induced on an endless substrate, such as a disc, drum, tape or the like which is made of an insulating or semiconductive material and moves between the capacitor plates so as to "read" the recorded data, which corresponds to particular distributions of the electric charges on the substrate and to the local density thereof.

The main object of the invention is to adapt measuring devices of the kind in question so that variations in the distance $d$ are automatically determined and preferably compensated at each instant.

According to the present invention a device for measuring quantities of electric charges comprises a capacitor, the capacitor having a measuring plate and another plate, means for applying an electrical parameter to the capacitor so that an electric charge representing the magnitude of the parameter is induced on the said measuring plate, means for modulating the quantity of the electric charge induced on the measuring plate at a first frequency $f_o$, means for modulating the quantity of the electric charge induced on the measuring plate at a second frequency $f_1$ which is less than $f_o/2$, means for generating an alternating electric signal representing the modulation of the induced charge, means for deriving from the said alternating electric signal a first component which has a frequency $f_o$ and represents the quantity of the induced charge, and means for deriving from the said alternating electric signal a second component which has a frequency $f_1$, the second component serving as a correction signal which depends upon the distance between the said measuring plate and the location at which the electrical parameter is applied to the capacitor.

The inventors have discovered that the part of the signal modulated at the frequency $f_1$ is independent of the parameter to be measured but dependent on the distance $d$, and can therefore safely be used to compensate for variations in this distance, inter alia by causing it to act on a suitable rapid-response control system adapted to modify the distance $d$ at each instant in a direction which tends to eliminate the modulated part at the same instant.

In preferred embodiments, one and/or more of the following features are also used:

One of the capacitor plates is arranged so as to vibrate mechanically in directions towards and away from the other plate.

The means for modulating the charge at the frequency $f_1$ operate by applying an electric voltage at a frequency $f_1$ between the capacitor plates.

The means for modulating the charge at the frequency $f_1$ operate by alternately moving one of the capacitor plates parallel to the other plate at the frequency $f_1$.

In a measuring device according to the preceding paragraph, the plate movable at frequency $f_1$ forms part of a reading head which comprises two electrodes, each ending in a point facing in the direction towards the other plate, one electrode being disposed in line with a first track bearing the electric charges, the quantities of which charges are to be measured and which vary along the track, and the other electrode being adapted to guide the head and being disposed in line with a second track bearing electric charges having a constant density along the entire length of the track, the two tracks being disposed parallel to one another on a single insulating or semiconductive substrate which, in use, is progessively moved forward between the two plates.

Preferably the substrate is a disc and the second plate is a metal layer covering the surface of the disc remote from the head, the two tracks having a spiral shape.

The two electrodes are suitably interconnected so that they can vibrate independently of one another but so that their average relative positions remain the same, and the vibrations at frequency $f_1$ are applied only to the second electrode.

Figure 2:
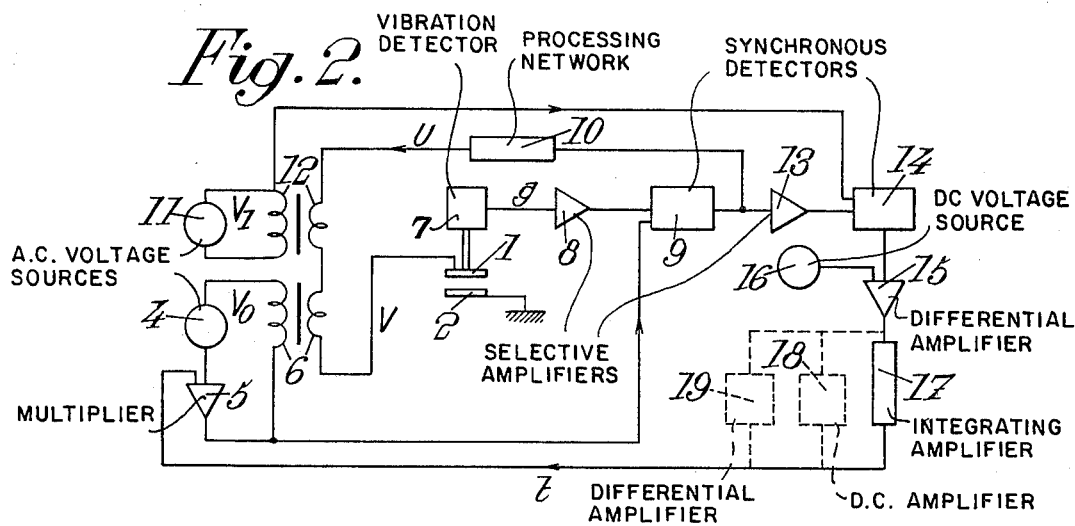
Figure 3:
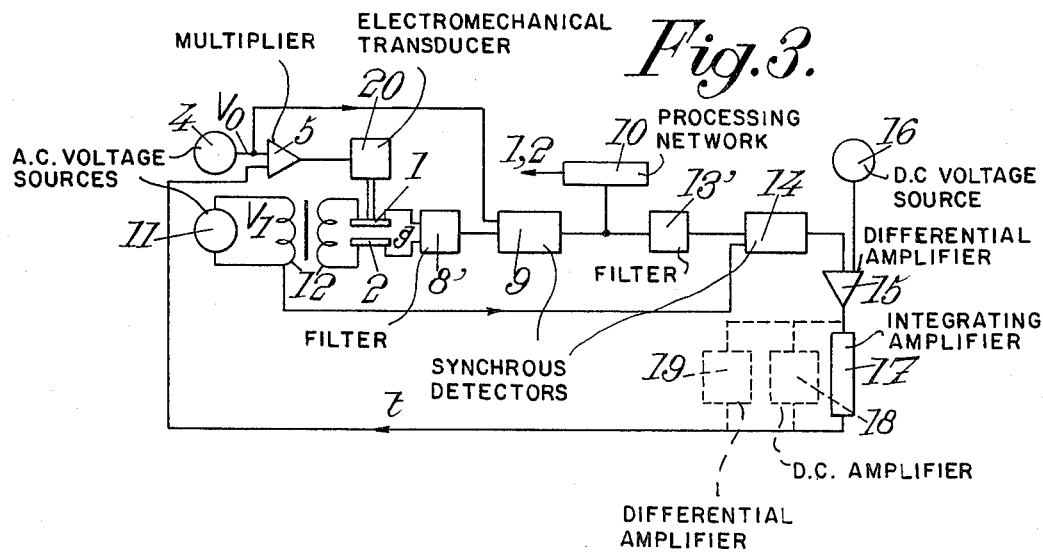

The invention will now be described, by way of example, with reference to the accompanying drawings, in which:

FIG. 1 is a block diagram showing the operation of devices according to the invention for measuring quantities of electric charges;

FIGS. 2-4 diagrammatically show three embodiments of the invention;

FIG. 5 is a graph illustrating one feature of the device in FIG. 4; and

FIGS. 6-8 diagrammatically show three variants of means used in the devices in question for producing modulation at frequency $f_o$.

FIG. 1 of the drawings illustrates the basic principle of the invention. In FIG. 1, a measuring capacitor is represented by two plates or electrodes, i.e. a first or measuring plate 1 and a second plate 2 which in this case is earthed.

In FIG. 1, electric charges, the quantities or local densities of which are to be studied, are carried by a substrate 3 made of insulating or semiconductive material. The substrate 3 is shown as separate from the two plates 1 and 2, but in many advantageous applications it is in contact with at least one plate, plate 2 advantageously being formed simply by metal-coating that surface of the substrate which is remote from plate 1.

It is known in the art of vibrating-capacitor electrometers to measure the quantity $x$ of electric charges on the substrate 3 by modulating at a frequency $f_o$ the quantity $y$ of electric charge which is induced by the charge $x$ on the measuring plate 1, then to generate an electric signal $g$ representing that part of quantity $y$ which is modulated at the frequency $f_o$, and finally to measure the signal $g$, which is dependent on the quantity of the charge $x$.

Hereafter, $d$ will be used to denote the distance between the measuring electrode 1 and the substrate 3 or plate 2, which amounts to the same when the substrate 3 is in contact with plate 2.

Variations in the distance $d$ influence the measurement of the quantity $x$.

If these variations occur they must be eliminated or compensated, e.g. during the reading of data recorded in the form of quantities of electric charges on an endless element forming the aforementioned substrate and moving between plates 1 and 2.

To this end, the quantity $y$ of the charge induced on the measuring plate 1 is modulated at a second frequency $f_1$ which is appreciably below the frequency $f_o$.

The signal $g$ is then modulated simultaneously at the two frequencies $f_o$ and $f_1$ and, strange to relate, the part of $g$ which is modulated at $f_1$ depends on the distance $d$ but not on the parameter $x$ to be measured. This part of $g$ forms an electric term $t$ which is used for automatically making the desired correction, as indicated by the arrow F in FIG. 1.

Arrow F' in FIG. 1 symbolises the recycling, if required, of the main measured result into the circuit so as to carry out a zero method.

Frequency $f_o$ is usually between 100 Hz and 1 MHz, and is advantageously of the order of 50-100 kHz.

Frequency $f_1$ is less than $f_o/2$ and usually less than $f_o/5$ or even $f_o/10$; it is usually above $f_o/100$. If it is higher, there is a corresponding increase in the response of the system, but there is also an increase in the instability of the system.

We shall now, with reference to FIGS. 2-4, give a more detailed description of three embodiments of the aforementioned measuring device.

The first embodiment, shown diagrammatically in FIG. 2, relates to an electrometer of the kind described in U.S. patent application Ser. No. 526,733 dated Nov. 25, 1974, now issued as U.S. Pat. No. 3,997,839.

In the manner disclosed by this specification, the device comprises:

a source 4 for producing an a.c. electric voltage $V_o$ having a frequency $f_o$, the source being connected between the plates 1 and 2 via a multiplier 5 and an insulating transformer 6, a detector 7 of mechanical vibrations (e.g. a piezoelectric, electrostatic, electromechanical, optical or other pickup) which is connected to one plate, e.g. plate 1, and adapted to generate an electric voltage $g$ at the same frequency as the vibrations and having an amplitude proportional to the amplitude of the vibrations, a selective amplifier 8 which is supplied with the voltage $g$ and has a pass-band centered at the frequency $f_o$, a synchronous detector 9 for receiving the signal from the amplifier 8 and a reference voltage which is part of the voltage $V_o$ but which is phase-shifted so as to be in phase with the signal component at frequency $f_o$, and a network 10 of components for processing the output of detector 9 so as to make the desired measurements and preferably so as to partially recycle a voltage $U$ which is related to the measured quantity $x$ and is applied to the terminals of the capacitor 1, 2 so that a zero method can be applied.

Alternatively, in accordance with the invention, the device comprises a source 11 for generating an a.c. voltage $V_1$ having a frequency $f_1$ appreciably below the frequency $f_o$ and connected, like the source 4, to the terminals of the capacitor 1, 2 via an insulating transformer 12. The windings of the transformers 6, 12 which are not connected to the associated sources 4, 11 are both connected in series with the plate 1, the pass band of the selective amplifier 8 centered at frequency $f_o$ is given a width of at least $2 f_1$ at midheight, and the following are successively added to the output of detector 9; a selective amplifier 13 having a pass-band centered at frequency $f_1$; a second synchronous detector 14 for receiving the signal from the amplifier 13 and a reference voltage, which is part of the voltage $V_1$ but which is phase-shifted so as to be in phase with the signal component at frequency $f_1$; a differential amplifier 15 having one input connected to the output of detector 14 and the other connected to a d.c. voltage source 16; and an integrating amplifier 17 which receives the output of amplifier 15.

The integrator output signal $t$ is applied to the multiplier 5 so as automatically and at each instant to correct the voltage $V_o$ by an amount sufficient to compensate for variations in the distance $d$ at the same time as the measurements are carried out. This is possible since the voltage $t$ depends on distance $d$ and not on the quantity of charge $x$ to be measured. Voltage $g$ is given by the formula:

$$g = \frac{K}{L^2} (U - X + v_o \sin 2\pi f_o t + v_1 \sin 2\pi f_1 t)^2$$

in which:
- $K$ is a constant depending on the sensitivity of the vibration detector 7,
- $L$ is a length equal to the average value of distance $d$, weighted to allow for the relative permittivity of the dielectric media between the plates,
- $U$ is the recycling voltage applied by network 10 to the terminals of capacitor 1, 2,
- $X$ is the "equivalent voltage of the sample" under study, depending on the quantity $x$ of the charge to be measured and the geometrical quantities characterising the system,
- $v_o$ is the amplitude of the voltage $V_o$, and
- $v_1$ is the amplitude of the voltage $V_1$.

It can be seen that if the length L varies, the voltage g also varies.

By expanding the above expression, we obtain the following expression for the term $g_o$ at the frequency $f_o$:

$$g_o = \frac{2K}{L^2} [(U - X)v_o + v_o v_1 \sin 2\pi f_1 t] \sin 2\pi f_o t$$

The term $g_o$ is of the following type:

$$(A + B) \sin 2 \pi f_o t$$

In this expression the two coefficients $A, B$ depend on the distance $d$, the coefficient $A$, which is independent of the frequency $f_1$ depends on X, but the coefficient $B$, which is modulated at the frequency $f_1$ does not depend on X.

The amplitude of the voltage $t$ generated in the circuit of FIG. 2 is undoubtedly representative of the coefficient B and can be safely used for correcting for variations in the distance $d$ as desired, simply by introducing it at a suitable point on the circuit so that it completely compensates for the effect of the distance $d$ in question on voltage $g$, allowing for the fact that voltage $g$ is inversely proportional to the square of distance $d$.

A d.c. amplifier 18 and/or a differentiating amplifier 19 are preferably connected in parallel with the amplifier 17 so as to increase the speed and reliability of the circuit response.

In the second embodiment (shown in FIG. 3), the a.c. voltage $V_o$ of frequency $f_o$, generated by the source 4, is applied via multiplier 5 to an element 20 (e.g. a piezoelectric, electrostatic or electromechanical device) which can convert the electric voltage into mechanical vibrations.

The element 20 is rigidly connected to one plate of the measuring capacitor, i.e. plate 1, whereas the plate 2 is stationary.

As before, the source 11 of a.c. voltage $V_1$ at frequency $f_1$ is connected to terminals 1, 2 of the measuring capacitor via an insulating transformer 12. The voltage g generated at the terminals 1, 2 is applied to a filter 8' having a pass-band centered at frequency $f_o$ and a width at mid-height of at least $2 f_1$.

The other circuit components 9, 10 and 13 to 19 are the same as in FIG. 2, except that the selective amplifier 13 has been replaced by a filter 13' having a pass-band centered at frequency $f_1$.

As before, the current from capacitor 1, 2 (i.e. the corresponding voltage g) can be considered as the sum of two terms which are both related to the distance $d$ but one of which is independent of the frequency $f_1$ and related to the quantity of charges $x$ to be measured, whereas the other is modulated at frequency $f_1$ and is independent of $x$.

The third embodiment (shown diagrammatically in FIG. 4) relates to a device for reading information stored on a rotating insulating disc 21 in the form of electric charges recorded along a spiral track 22. In this device, a reading head 23 is very accurately guided along a direction axially of the disc (hereinafter assumed to be vertical) and along a direction radial thereof.

The non-vibrating plate in the previous embodiments is replaced by a metal casing 24 on the bottom surface of disc 21.

The top surface of disc 21 bears the track 22, on which the information to be read has been recorded, and a second spiral track 25 which is located between successive turns of the track 22. The track 25 bears electric charges of constant density along its entire length and acts as a guide track, as will be explained hereinafter.

Each of the two parallel tracks 22, 25 has an average width P which is preferably between 0.5 microns and 2 mm, and each track is separated from the other by a space I of the same order of size as P.

FIG. 5 shows the variations in the density of the electric charge along a radius of the top surface of disc 21, the density $c$ being shown along the ordinate and the length $r$ of the radius under consideration being plotted along the abscissa.

The reading device substantially comprises two conductive needles 26, 27 whose points have diameters D of the same order of size as P, the diameters D of course being less than the sum of P and 2I in every case.

The needles 26, 27 replace the vibrating plate in the previous embodiments. Their points are disposed in line with and above the tracks 22, 25, respectively. They are interconnected so that their average positions with respect to one another are fixed, but they can vibrate independently of one another.

The needle 26, which is adapted to read the information on track 22, is connected to an electromechanical device 20 which is constructed and energised in a manner described with reference to FIG. 3, and the voltage which appears between the needle 26 and the metal layer 24 is processed by an assembly 28 of the same kind as before.

Needle 27 is adapted to guide the reading head both horizontally and vertically with respect to the track 25. It is rigidly connected to two electromechanical devices 29, 30 adapted to convert a.c. electric voltages applied to them into mechanical vibrations at the same frequency, along a vertical and a radial direction of disc 21 respectively.

A source 4 of a.c. voltage $V_o$ at frequency $f_o$ energises the device 29 and a source 11 of a.c. voltage $V_1$ at frequency $f_1$ energises device 30.

The drawing also shows the following network of electronic components connected between the needle 27 and the layer 24; a filter 8' having a pass-band centered at $f_o$ and a width at mid-height of at least $2 f_1$, a synchronous detector 9 whose reference voltage is a part of the voltage $V_o$, a filter 13' having a pass-band centered at frequency $f_1$ and a synchronous detector 14 whose reference voltage is part of the voltage $V_1$.

The output voltage of detector 14 contains information giving the horizontal distance between needle 27 and the centre of the facing guide track 25. This voltage is processed so as automatically to modify the horizontal position of the reading head 23 in the horizontal direction, thus tending at each instant to re-centre the needle 27 on the track 25, using any suitable electric, mechanical, pneumatic, hydraulic or other amplification or detection or control means 31.

The second synchronous detector is not required for correcting the vertical position of head 23. The output of detector 9 is directly applied to the first input of a summing or differential amplifier 32 whose second input is connected to an adjustable d.c. voltage source 33; the part of the output voltage of amplifier 32 which is not modulated at frequency $f_1$ remains constant if the vertical distance $d$ between needle 27 and track 25 does not change, and increases if the distance $d$ increases and vice versa, so that this part may quite suitably comprise the desired error signal.

The same part is processed in suitable electric, mechanical, pneumatic, hydraulic or other filter, detection, amplification or control means 34 so as automatically to modify the height of reading head 23 with respect to disc 21 in a direction which tends to keep distance $d$ between the two elements constant.

Guide track 25 can be formed in any desired manner, inter alia by depositing charges at constant density on the disc or by depositing a small-diameter metal wire or a very thin metal layer at a constant potential.

A number of other means could be used for producing at least one of the two modulations at frequency $f_o$ and $f_1$ of the charges induced on the measuring plate by the electric phenomenon under study. More particularly, modulation at frequency $f_o$ may be produced by periodically blocking the path between the plates 1 and 2 (or between plate 2 and substrate 3) so as to alternately allow and prevent the electric charges from being induced at frequency $f_o$ on plate 1 as a result of the charges on plate 2 (or substrate 3).

Blocking of this kind can be produced by conductive plates 35 (FIG. 6) in the form of circular sectors electrically connected to one another and to one plate and assembled so that they oscillate at frequency $f_o$ in a plane parallel to and between the plane of the plates reciprocating through an angle around a vertical axis.

In this case, the aforementioned voltage $V_o$ at frequency $f_o$ produced by source 4 can be used to energise a means 36 for controlling the oscillations and can also comprise the reference voltage of detector 9, but it is not applied to the terminals of capacitor 1, 2 as in FIG. 2 or to the terminals of a piezoelectric or other device adapted to vibrate plate 1 as in FIG. 3. On the other hand there is no change with regard to frequency $f_1$.

Using the same conventions as before, it can be shown that the component at frequency $f_o$ of the current collected at the terminals of capacitor 1, 2 is then in the form:

$$\frac{Kf_o}{L}(X - U + v_1 \sin 2\pi f_1 t)$$

which can as before be considered as comprising a term which is dependent on X and not on the frequency $f_1$ and a term which is modulated at the frequency $f_1$ and is independent of X, the consequences being the same as before with regard to the possibility of corrections, if required. Alternatively, the aforementioned blocking can be produced by rotating a disc 37 formed with at least one eccentric aperture 38, e.g. four such apertures, as shown in FIGS. 7 and 8. The apertures 38 are disposed so as to move between plates 1, 2 during rotation of the disc 37, which is made of conductive material and is electrically connected to one plate.

The rotation of disc 37 can then be used to produce the a.c. voltage at frequency $f_o$ which is the reference voltage for detector 9. To this end, an electric switch 40 can be periodically opened by stops 39 (FIG. 7) driven by the disc, the moving contact of the switch being disposed in the path of the stops and the switch being disposed in an electric circuit 41 comprising a d.c. current source 42 and the a.c. charge 43 to be supplied at frequency $f_o$. In this case, of course, where the number of apertures is equal to 4, disc 37 rotates at $f_o/4$ revolutions per second if $f_o$ is expressed in Hertz.

Alternatively, a photoelectric cell 44 can be periodically excited by a light ray 45 coming from a light source 46 via apertures 38 in succession, the cell being mounted in the circuit 41 corresponding to the preceding circuit and adapted to break the circuit when not illuminated, and vice versa.

The previously-described methods of correction are equally applicable if the semiconductive or insulating support of the two parallel plates used respectively for recording and guiding the charges under study is borne by a substrate which has a shape different from a disc, e.g. a tape moving past the two needles 26, 27, which in that case are aligned along the width of the tape, the two tracks extending parallel to the length of the tape on the same side thereof; or a drum moving past the two needles, which in that case are aligned along a generatrix of the drum, the two tracks each being a helix winding around the drum.

In both cases, since the read-out electrode (needle 26) can have a very small diameter, excellent spatial resolution can be obtained; more particularly the number of spiral tracks or "furrows" bearing electrical information and adapted to be carried by a single disc is much greater than the corresponding number of magnetically recorded tracks.

Accordingly, this constitutes a considerable advance in the domain of information-reading devices, since more particularly the very fine measuring electrode can instantly and with high precision follow any irregularities in the substrate bearing the recorded message, by exactly compensating changes in the distance between the electrode and the scanned track.

The information in question can be of any desired nature. More particularly, it can be recorded in a non-linear form, e.g. in the form of a surface associated with means for scanning it line by line like a television screen, the spatial resolution being excellent if the read-out plate has a point or other conductive element terminating in a very fine point in the direction of the other plate. In this case the information in question can be in the form of images recorded in the form of electric charges on preferably flat or cylindrical photoelectric substrates or on electro-photographic paper.

The invention can have many applications in addition to those mentioned, e.g. to electrometry, checking the manufacture of synthetic fibres or plastics films or strips, electrophotography, optical or acoustic holography, sound or ultra-sound reproduction, computers (more particularly stores thereof) etc. Of course, the invention is in no way limited to any of the embodiments or applications described in detail hereinbefore. For example, a method similar to that explained with reference to FIG. 2 could be adopted in preference to the method explained with reference to FIG. 3 in order to produce and process the vertical vibrations of needles 26, 27 in the circuit in FIG. 4. Similarly, without departing from the invention, use could be made of the aforementioned rigorous guidance of read-out head 23 by causing needle 27 to scan a track 25 having charges at a constant density, except that needle 26 is used for recording instead of reading-out, inter alia by replacing means 28 by others adapted to modulate, depending on the information to be recorded, either an electric voltage to which the needle is brought, in which case the recording on the insulating substrate is produced by a corona effect, or an injection of charges on to the substrate via a needle by a wetting contact between the needle and the substrate, or a discharge of electrons or ions sprayed on to the substrate by an electron gun, which takes the place of the needle.

Alternatively, the needles or points may be replaced by other conductive elements having a pointed end and embedded, if necessary, in an insulating material except for the end disposed opposite the charges under study.

We claim:

1. A device for measuring quantities of electric charges, the device comprising a capacitor, the capacitor having a measuring element and another element, means for applying an electrical parameter to the capacitor so that an electric charge representing the magnitude of the parameter is induced on the said measuring element, means for modulating the quantity of the electric charge induced on the measuring element at a first frequency $f_o$, means for modulating the quantity of the electric charge induced on the measuring element at a second frequency $f_1$ which is less than $f_o/2$, means for generating an alternating electric signal representing the modulation of the induced charge, means for deriving from the said alternating electric signal a first component which has a frequency $f_o$ and represents the quantity of the induced charge, and means for deriving from the said alternating electric signal a second component which has a frequency $f_1$, the second component serving as a correction signal which depends upon the distance between the said measuring element and the location at which the electrical parameter is applied to the capacitor.

2. A measuring device as claimed in claim 1, wherein one of the elements of the capacitor is so arranged that, in use, the said one capacitor element can be vibrated mechanically in directions towards and away from the other element.

3. A measuring device as claimed in claim 2, wherein the means for modulating the quantity of the induced charge at the frequency $f_1$ comprise means for applying an electric voltage at a frequency $f_1$ between the elements of the capacitor.

4. A measuring device as claimed in claim 2, wherein the said means for modulating the quantity of the induced charge at the frequency $f_o$ comprise an electromechanical transducer adapted to mechanically vibrate the said one capacitor element.

5. A measuring device as claimed in claim 4, wherein the means for deriving the component modulated at frequency $f_1$ also comprise amplification and filtering means, and a second synchronous detector having one input which is supplied with the signal from the second selective amplifier or filter and a second input which is supplied with a reference signal which is a voltage of frequency $f_1$ in phase with the said second component at frequency $f_1$, and means are provided for supplying an output voltage from the second synchronous detector to the amplification and filtering means, and control means are arranged so as automatically to modify the relative positions of the elements of the capacitor so as to keep the voltage generated by the control means at a constant or zero value.

6. A measuring device as claimed in claim 2, wherein the said means for modulating the quantity of the induced charge at the frequency $f_o$ comprise means for applying an a.c. excitation voltage at a frequency $f_o$ between the plates of the capacitor, and the said means for deriving the said first component at frequency $f_o$ comprise means for detecting the component of frequency $f_o$ in the mechanical vibrations produced by the application of the excitation voltage between the elements.

7. A measuring device as claimed in claim 6, wherein the means for deriving the component of frequency $f_1$ also comprises amplification and filtering means, and a second synchronous detector having one input which is supplied with the signal from the second selective amplifier or filter and a second input which is supplied with a reference signal which is a voltage of frequency $f_1$ in phase with the said second component of frequency $f_1$, and means are provided for supplying an output voltage from the second synchronous detector to the amplification and filtering means, and control means are adapted to act on the excitation voltage so as to keep the voltage generated by the control means at a constant or zero value.

8. A measuring device as claimed in claim 1, wherein the means for modulating the quantity of the induced charge at the frequency $f_1$ comprise means for alternately moving one of the capacitor elements in directions towards and away from the other element at the frequency $f_1$.

9. A measuring device as claimed in claim 8, wherein the said element which is movable at frequency $f_1$ forms part of a reading head, the said reading head comprises two electrodes, each electrode ends in a point which faces in the direction of the said other element, one of the said electrodes is disposed in line with a first track bearing the electric charge whose quantity is to be measured and whose density varies along the said track, and the other of the said electrodes being adpated to guide the head and being disposed in line with a second track bearing electric charges having a constant density along the entire length of the track, the two tracks being disposed parallel to one another on a single insulating or semiconductive substrate which, in use, is progressively moved forward between the two elements.

10. A measuring device as claimed in claim 9, wherein the said substrate is a disc and the said other plate is a metal layer covering the surface of the disc remote from the head, the two tracks having a spiral shape.

11. A measuring device as claimed in claim 9, wherein the two electrodes are interconnected so that they can be vibrated independently of one another but so that their average relative positions remain the same, the vibrations at frequency $f_1$ being applied only to the second electrode.

12. A measuring device as claimed in claim 1, wherein the means for deriving the component of frequency $f_1$ comprise a selective amplifier or a filter centered at the frequency $f_o$ and having a pass-band at mid-height of $2f_1$.

13. A measuring device as claimed in claim 12, wherein the means for deriving the component at the frequency $f_1$ also comprise a synchronous detector, the said synchronous detector having one input which is supplied with the signal from the selective amplifier or filter and a second input which is supplied with a reference voltage, which is a voltage of frequency $f_o$ in phase with the signal component of frequency $f_o$.

14. A measuring device as claimed in claim 13, wherein the means for deriving the component of frequency $f_1$ also comprise a second selective amplifier or filter, means are provided for applying the output voltage of the synchronous detector to the second selective amplifier, and the second selective amplifier is adapted to separate the two components of the output voltage, which components are independent of the frequency $f_1$ and modulated at frequency $f_1$, respectively.

15. A measuring device as claimed in claim 14, wherein the means for deriving the component modulated at the frequency $f_1$ also comprise a second synchronous detector, the second synchronous detector has one input which is supplied with the signal from the second selective amplifier or filter and a second input which is supplied with a reference signal which is a voltage of frequency $f_1$ in phase with the said second component at frequency $f_1$.

16. A measuring device as claimed in claim 1, wherein the said means for modulating the quantity of charge at frequency $f_o$ comprise means for blocking the path between the elements of the capacitor periodically at frequency of $f_o$.

17. A device as claimed in claim 1, wherein the said measuring element comprises at least one conductive element which extends longitudinally towards the said other element and the end of which has a dimension transverse to the longitudinal axis of said conductive element of between 0.5 microns and 2 mm.

* * * * *